United States Patent
Walther et al.

(10) Patent No.: US 7,342,240 B2
(45) Date of Patent: Mar. 11, 2008

(54) ION BEAM CURRENT MONITORING

(75) Inventors: Steven R. Walther, Andover, MA (US); Morgan Evans, Manchester, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 200 days.

(21) Appl. No.: 11/361,765

(22) Filed: Feb. 24, 2006

(65) Prior Publication Data

US 2007/0200075 A1    Aug. 30, 2007

(51) Int. Cl.
*H01J 37/317* (2006.01)
*H01J 37/304* (2006.01)

(52) U.S. Cl. .............. 250/492.21; 250/251; 250/397; 250/398; 250/423 R (58) Field of Classification Search .............. None
See application file for complete search history.

(56) References Cited

U.S. PATENT DOCUMENTS

| | | | |
|---|---|---|---|
| 4,980,562 A | 12/1990 | Berrian et al. | |
| 5,587,587 A * | 12/1996 | Hashimoto | 250/492.21 |
| 6,323,497 B1 | 11/2001 | Walther | |
| 6,452,197 B1 * | 9/2002 | Ito | 250/492.21 |
| 6,608,316 B1 | 8/2003 | Harrison | |
| 6,891,173 B2 * | 5/2005 | Gammel et al. | 250/492.21 |
| 2002/0130275 A1 * | 9/2002 | Mack et al. | 250/492.1 |

* cited by examiner

*Primary Examiner*—Nikita Wells (57) ABSTRACT

An ion beam monitoring system includes a charge neutralization system and a sensor. The charge neutralization system is configured to provide a compensating current to control a charge on a front surface of a wafer. The sensor is configured to sense the compensating current and provide a sensor signal in response to the compensating current, wherein the sensor signal is representative of a beam current of an ion beam. The charge neutralization system may include a plasma flood gun configured to provide the compensating current to the ion beam.

21 Claims, 8 Drawing Sheets

ION BEAM CURRENT MONITORING

FIELD

This invention relates to ion implantation and, more particularly, to ion beam current monitoring in an ion implantation system.

BACKGROUND

Ion implantation is a standard technique for introducing conductivity—altering impurities into semiconductor wafers. A desired impurity material may be ionized in an ion source, the ions may be accelerated to form an ion beam of prescribed energy, and the ion beam may be directed at a front surface of the wafer. The energetic ions in the beam penetrate into the bulk of the semiconductor material and are embedded into the crystalline lattice of the semiconductor material to form a region of desired conductivity. The ion beam may be distributed over the wafer area by beam scanning, by wafer movement, or by a combination of beam scanning and wafer movement. Introducing the impurities at a uniform depth and density into the wafers is important to ensure that the semiconductor device being formed operates within specification.

One factor that can affect the uniformity of the impurity dose into the wafer is the ion beam current. An unexpected fluctuation in ion beam current may degrade the resulting uniformity of the impurity dose. Accordingly, various conventional ion beam current monitoring systems have been developed. One conventional ion beam current monitoring system utilizes a Faraday sensor disposed proximate the wafer that periodically samples the ion beam current as the ion beam is moved relative to the wafer. A drawback with this approach is that when the ion beam is actually striking the wafer, the beam current is not being monitored. Therefore, if an unexpected fluctuation in beam current occurs during this time and then corrects itself by the time the ion beam strikes the sampling Faraday sensor, the magnitude and duration of the unexpected fluctuation would not be known.

Another conventional ion beam current monitoring system may continuously monitor the magnetic field of the ion beam. Fluctuations in the magnetic field may then be correlated to changes in ion beam current. A drawback of this approach is its limited applicability to relatively high beam current values since a relatively high beam current is necessary to provide a sufficient magnetic field to be sensed.

Yet another conventional ion beam current monitoring system may continuously monitor power supply currents via a total return current in the flight tube of a batch tool. The measured total return current in the flight tube may then be used to provide an indication of the total ion beam current leaving the fight tube. A drawback with this approach is the precision of the correlation between the measured total return current to the actual ion beam current. The actual ion beam current delivered to the wafer in the end station may be affected by other indicia not detected by the total ion beam current leaving the flight tube.

Accordingly, there is a need for new and improved methods and apparatus for ion beam current monitoring.

SUMMARY

According to a first aspect of the invention, an ion beam current monitoring system is provided. The ion beam current monitoring system includes a charge neutralization system configured to provide a compensating current to control a charge on a front surface of the wafer, and a sensor. The sensor is configured to sense the compensating current and provide a sensor signal in response to the compensating current. The sensor signal is representative of a beam current of an ion beam.

According to another aspect of the invention, a method is provided. The method includes providing an ion beam directed to a front surface of a wafer, providing a compensating current to control a charge on the front surface of the wafer, sensing the compensating current, and providing a sensor signal in response to the compensating current. The sensor signal is representative of a beam current of the ion beam.

According to yet another aspect of the invention, an ion implantation system is provided. The ion implantation system includes an ion beam generator configured to provide an ion beam directed to a front surface of a wafer. The ion implantation system also includes a charge neutralization system configured to provide a compensating current to control a charge on a front surface of the wafer, and a sensor. The sensor is configured to sense the compensating current and provide a sensor signal in response to the compensating current, wherein the sensor signal is representative of a beam current of the ion beam.

According to yet another aspect of the invention, another ion beam current monitoring system is provided. The ion beam current monitoring system includes a plasma flood gun configured to provide a compensating current to control a charge on a front surface of a wafer, and a sensor. The sensor is configured to sense the compensating current and provide a sensor signal in response to the compensating current, wherein the sensor signal is representative of a beam current of an ion beam.

BRIEF DESCRIPTION OF THE DRAWINGS

For a better understanding of the present invention, reference is made to the accompanying drawings, which are incorporated herein by reference and in which.

DETAILED DESCRIPTION

The invention is described herein in connection with an ion implantation system. However, the invention can be used with other systems and processes that use beams of energetic charged particles, such as electron beam imaging systems. Thus, the invention is not limited to the specific embodiments described below.

Figure 1:
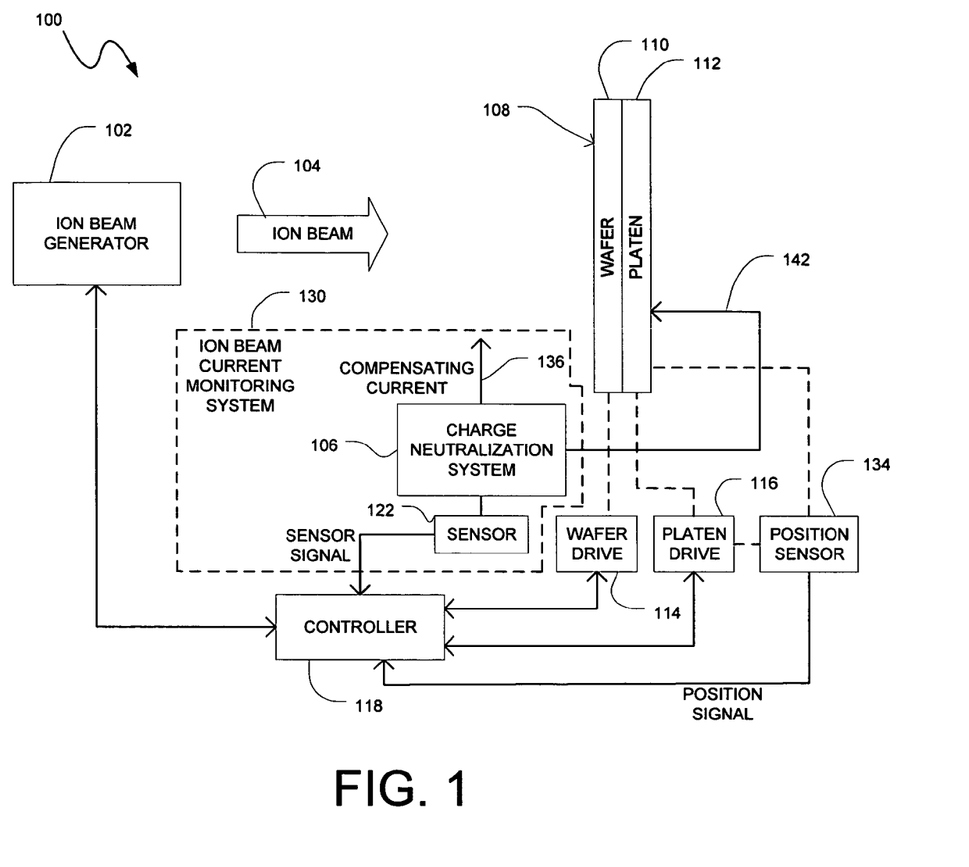
FIG. 1 is a schematic block diagram of an ion implantation system including an ion beam generator and an ion beam current monitoring system in accordance with the invention.

FIG. 1 illustrates a block diagram of an ion implantation system 100 including an ion beam generator 102 and an ion beam current monitoring system 130 consistent with an embodiment of the invention. The ion beam generator 102 may generate an ion beam 104 and direct it towards a front surface 108 of a wafer 110. The ion beam 104 may be distributed over the wafer area by beam scanning, by wafer movement, or by a combination of beam scanning and wafer movement.

The ion beam generator 102 can include various types of components and systems to generate the ion beam 104 having desired characteristics. The ion beam 104 may be a spot beam or a ribbon beam. The spot beam may have an approximately circular cross-section of a particular diameter depending on the characteristics of the spot beam. The ribbon beam may have a large width/height aspect ratio and may be at least as wide as the wafer 110. The ion beam 104 can be any type of charged particle beam, such as an energetic ion beam used to implant the wafer 110. The wafer 110 can take various physical shapes such as a common disk shape. The wafer 110 can be a semiconductor wafer fabricated from any type of semiconductor material such as silicon or any other material that is to be implanted using the ion beam 104.

The ion beam current monitoring system 130 may monitor a beam current, i.e., an amount of charge carried by particles in the beam 104 to the wafer 110. The ion beam current monitoring system 130 may generally include a charge neutralization system 106 and a sensor 122. The charge neutralization system 106 may be configured to provide a compensating current to control a charge on the front surface 108 of the wafer 110. The charge on the front surface of the wafer may accumulate due to charged particles from the ion beam 104 striking the wafer. An excessive accumulation of charge on the wafer 110 may lead to damage of the devices on the wafer 110. Hence, the charge neutralization system 106 is designed to control such charge accumulation. The charge neutralizing system 106 may include a plasma flood gun (PFG), and/or a grounding arrangement to ground the wafer 110 when coupled to the platen 112, and/or other systems to provide a compensating current to control a charge on the front surface of the wafer 110.

The compensating current may be provided to the ion beam 104 proximate the front surface 108 of the wafer 110 by a PFG as illustrated by path 136. The compensating current may also be provided to the rear surface of the wafer 110 via the platen 112 by a grounding arrangement as illustrated by path 142. The sensor 122 may be configured to sense the compensating current and provide a sensor signal in response to the compensating current. Advantageously, the sensor signal is representative of the beam current of the ion beam 104.

The controller 118 may accept the sensor signal from the sensor 122 as well as other signals and store and/or process the sensor signal. In response to the sensor signal, the controller 118 may initiate a variety of actions to control the ion beam generator 102, the wafer drive 114, the platen drive 116, and/or other components and systems of the ion implantation system 100.

The controller 118 can be or include a general-purpose computer or network of general-purpose computers that may be programmed to perform desired input/output functions. The controller 118 can also include other electronic circuitry or components, such as application specific integrated circuits, other hardwired or programmable electronic devices, discrete element circuits, etc. The controller 118 may also include user interface devices such as touch screens, user pointing devices, displays, printers, etc. to allow a user to input commands and/or data and/or to monitor the system 100. The controller 118 may also include communication devices and data storage devices.

The controller 118 may also communicate with and control the wafer drive 114 and the platen drive 116. The wafer drive 114 may include various devices or systems to physically move the wafer 110 to and from the platen 112. When the wafer drive 114 moves the wafer 110 to the platen 112 from a holding area, the wafer 110 may be clamped to the platen 112 using known techniques, e.g., electrostatic wafer clamping where the wafer is clamped to the platen with electrostatic forces or mechanical clamping where the wafer is clamped to the platen with mechanical forces. Once the wafer 110 is clamped to the platen 112, the platen drive 116 may move the platen 112, and hence the wafer 110, relative to the ion beam 104. The platen drive 116 may include various devices or systems to move the platen 112 in a desired way. For example, the platen drive 116 may include servo drive motors, screw drive mechanisms, mechanical linkages, and any other components as are known in the art.

A position sensor 134 may be coupled to a transport mechanism such as the platen drive 116 to provide a sensor signal representative of the position of the wafer 110 relative to the ion beam 104. Although illustrated as a separate component, the position sensor 134 may be part of other systems such as the platen drive 116 and the position sensor may be any type of position sensor known in the art such as a position-encoding device. The position signal from the position sensor 134 may be provided to the controller 118. The controller 118 may then correlate a start time of any reduction in ion beam current with a corresponding position of the ion beam relative to the wafer 110 by analysis of the sensor signal from the sensor 122 and the position signal from the position sensor 134.

Figure 2:
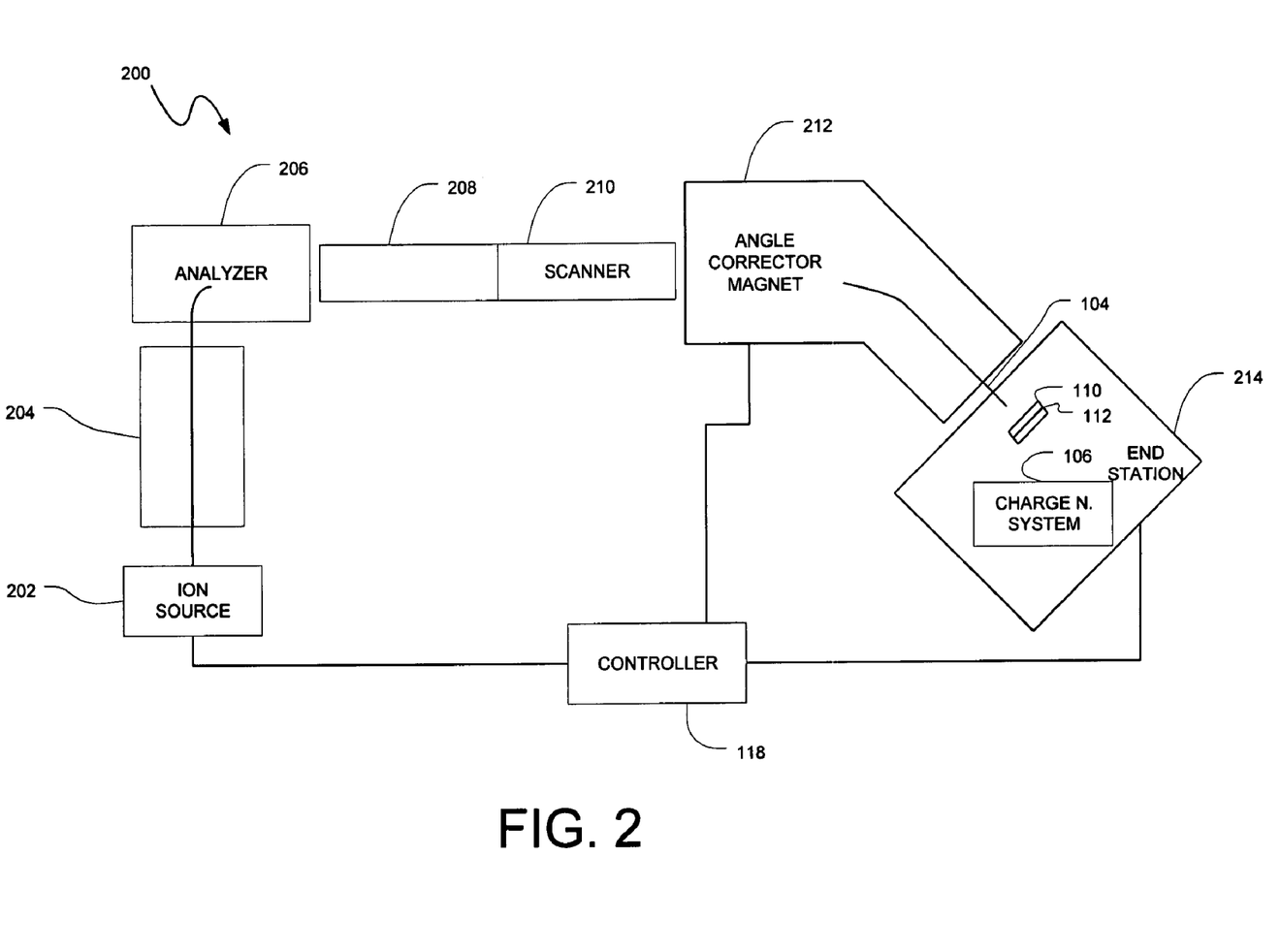
FIG. 2 is a schematic block diagram of another ion implantation system in accordance with the invention.

Turning to FIG. 2, a block diagram of one embodiment of an ion implantation system 200 is illustrated. Many other ion implantation systems will be known to those skilled in the art and the embodiment of FIG. 2 is provided by way of example only and is not intended to be limiting. The ion implantation system 200 may include an ion source 202, an extraction electrode 204, a mass analyzer 206, a resolving aperture 208, a scanner 210, an angle corrector magnet 212, an end station 214, and the controller 118. The ion beam current monitoring system 130 of FIG. 1 may be disposed in the end station 214 of the ion implantation system 200.

The ion source 202 may generate ions and may include an ion chamber and a gas box containing a gas to be ionized. The gas may be supplied to the ion chamber where it is to be ionized. The ions thus formed may be extracted from the ion source 202. The extraction electrode 204 and an extraction power supply may accelerate ions from the ion source. The extraction power supply may be adjustable as controlled by the controller 118. The construction and operation of ion sources are well known to those skilled in the art.

The mass analyzer 206 may include a resolving magnet that deflect ions so that ions of a desired species pass through the resolving aperture 208 and undesired species do not pass through the resolving aperture 208. In one embodiment, the mass analyzer 206 may deflect ions of the desired species by 90 degrees. A scanner 210 positioned downstream from the resolving aperture 208 may include scanning electrodes as well as other electrodes for scanning the ion beam. The scanner 210 is not required for systems using a ribbon beam. The angle corrector magnet 212 deflects ions of the desired ion species to convert a diverging ion beam to a nearly collimated ion beam having substantial parallel ion trajectories. In one embodiment, the angle corrector magnet 212 may deflect ions of the desired ion species by 70 degrees.

The end station 214 may support one or more wafers in the path of the ion beam 104 such that ions of the desired species are implanted into the wafer 110. The charge neutralizing system 106 may be disposed in the end station 214 to provide a compensating current to the wafer 110 to control a charge on the front surface of the wafer 110.

Figure 3:
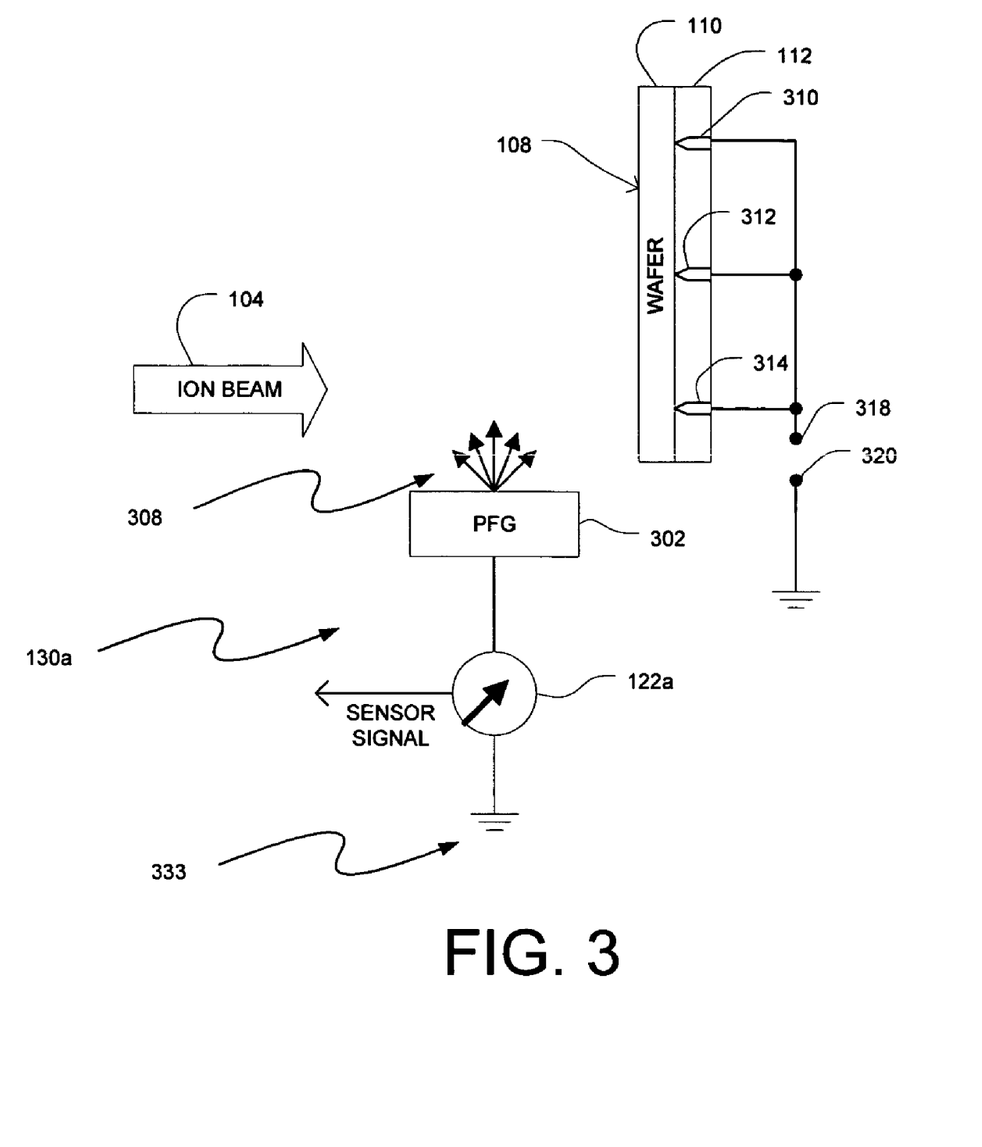
FIG. 3 is a schematic diagram of a first embodiment of the ion beam current monitoring system of FIG. 1.

FIG. 3 illustrates a diagram of a first embodiment of an ion beam current monitoring system 130a consistent with the ion beam current monitoring system 130 of FIG. 1. The ion beam current monitoring system 130a may include a PFG 302 and an ammeter 122a as the sensor 122. The ammeter 122a may be coupled to ground 333 and to the PFG 302. Any other charge neutralizing system may be inactive such that the PFG 302 provides all of the compensating current. For instance, the platen grounding pins 310, 312, 314 if present may be disconnected from ground at terminals 318 and 320.

As is known in the art, the PFG 302 may be disposed proximate the wafer 110 in the end station. The PFG 302 may be disposed vertically upstream from the front surface 108 of the wafer 110 in a direction defined by the ion beam 104. The PFG 302 may at ground potential and may provide compensating current in the form of low energy electrons 308 to the ion beam 104. The PFG 302 may be self-regulating in that the quantity of electrons it provides depends on the particular ion beam 104 and the accumulated positive charge on the front surface of the wafer 110. In other words, the PFG 302 provides more electrons to a higher positively charged ion beam and less electrons to a comparatively lower positively charged ion beam. In one embodiment, the PFG 302 may include an arc chamber containing a filament driven by a PFG arc current to provide the low energy electrons 308.

In operation, the PFG 302 may provide a compensating current in the form of low energy electrons 308 to neutralize the ion beam 104 when the ion beam strikes the front surface 108 of the wafer 110. The quantity of compensating current provided by the PFG 302 may vary depending on the presence and type of the ion beam 104, as well as any fluctuations in the beam current of the ion beam 104. As the PFG 302 provides the compensating current to the ion beam 104, electrons from ground 333 flow through the ammeter 122a to maintain the PFG 302 at ground potential. The quantity of electrons flowing through the ammeter 122a may be equal to the compensating current provided by the PFG 302. The ammeter 122a may then provide the sensor signal, e.g., to controller 118. Advantageously, the sensor signal is also representative of beam current of the ion beam 104. This then enables sensing of any fluctuations in beam current to be monitored when the ion beam strikes the wafer so the controller 118 may take corrective action if necessary when beam current fluctuations are detected.

Figure 4:
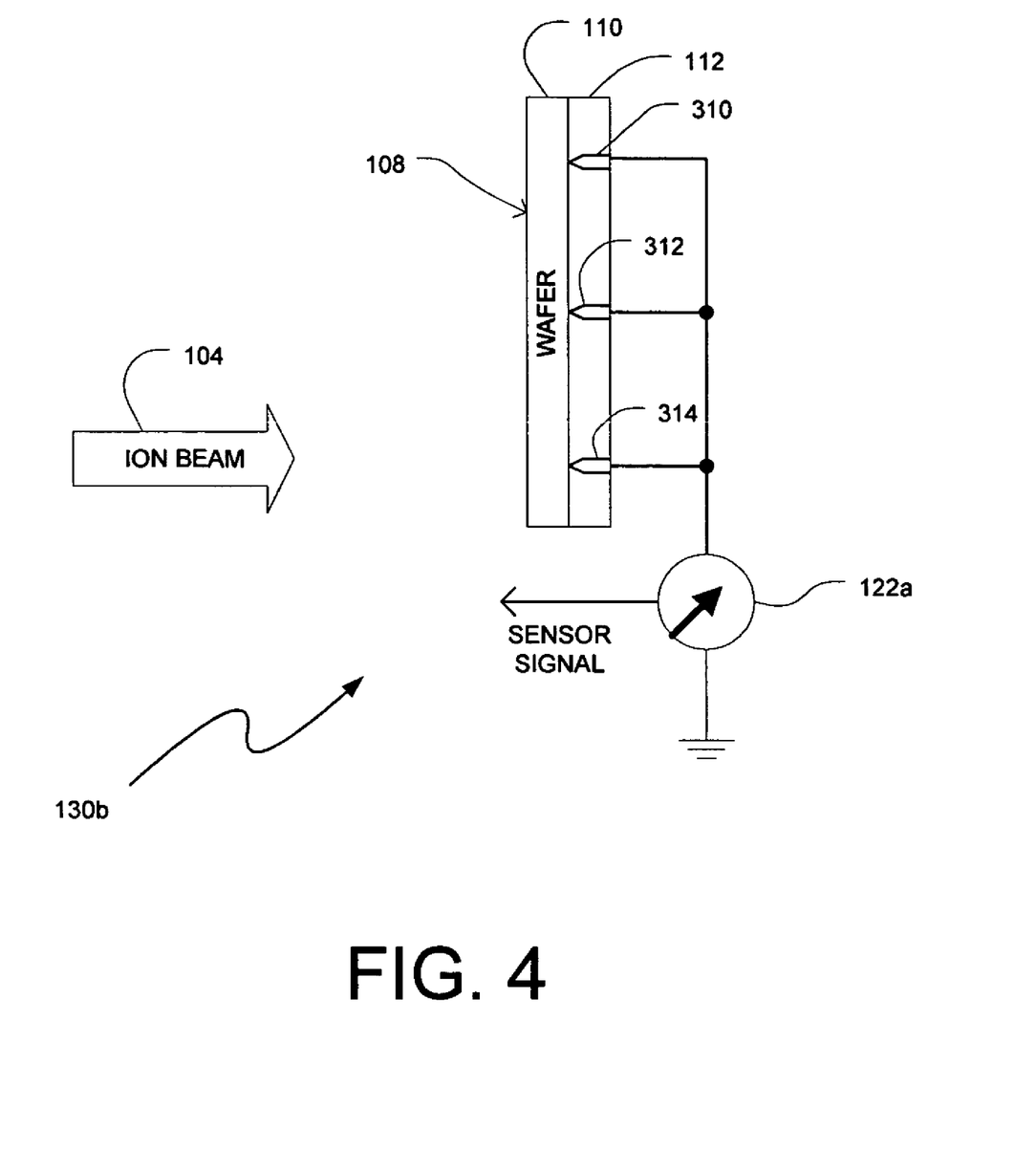
FIG. 4 is a schematic diagram of a second embodiment of the ion beam current monitoring system of FIG. 1.

FIG. 4 illustrates a diagram of a second embodiment of an ion beam current monitoring system 130b consistent with the ion beam current monitoring system 130 of FIG. 1. The ion beam current monitoring system 130b may include at least one grounding pin coupled to a rear surface of the wafer 110 when the wafer 110 is supported by the platen 112. All other charge neutralization systems may not be present or may be inactive, e.g., any PFG is turned off. In the embodiment of FIG. 4, a plurality 310, 312, 314 of grounding pins may be utilized.

In operation, as a positive charge is built up on the front surface 108 of the wafer 110, a compensating current in the form of electrons may flow from ground through the ammeter 122a to neutralize the positive charge build up. The quantity of the compensating current sensed by the ammeter 122a may depend on the presence and type of the ion beam 104, as well as any fluctuations in the beam current of the ion beam 104. To ensure accuracy of the sensor signal provided by the ammeter 122a of FIG. 4, care should be taken to ensure a sufficient electrical connection between the grounding pins 310, 312, and 314 and the rear surface of the wafer 110. Damage, wear, and contamination to the pins 310, 312, and 314 as well as an insulating layer on the rear surface of the wafer 110 may adversely affect the sufficiency of the electrical connection between the grounding pins 310, 312, and 314 and the rear surface of the wafer 110.

Figure 5:
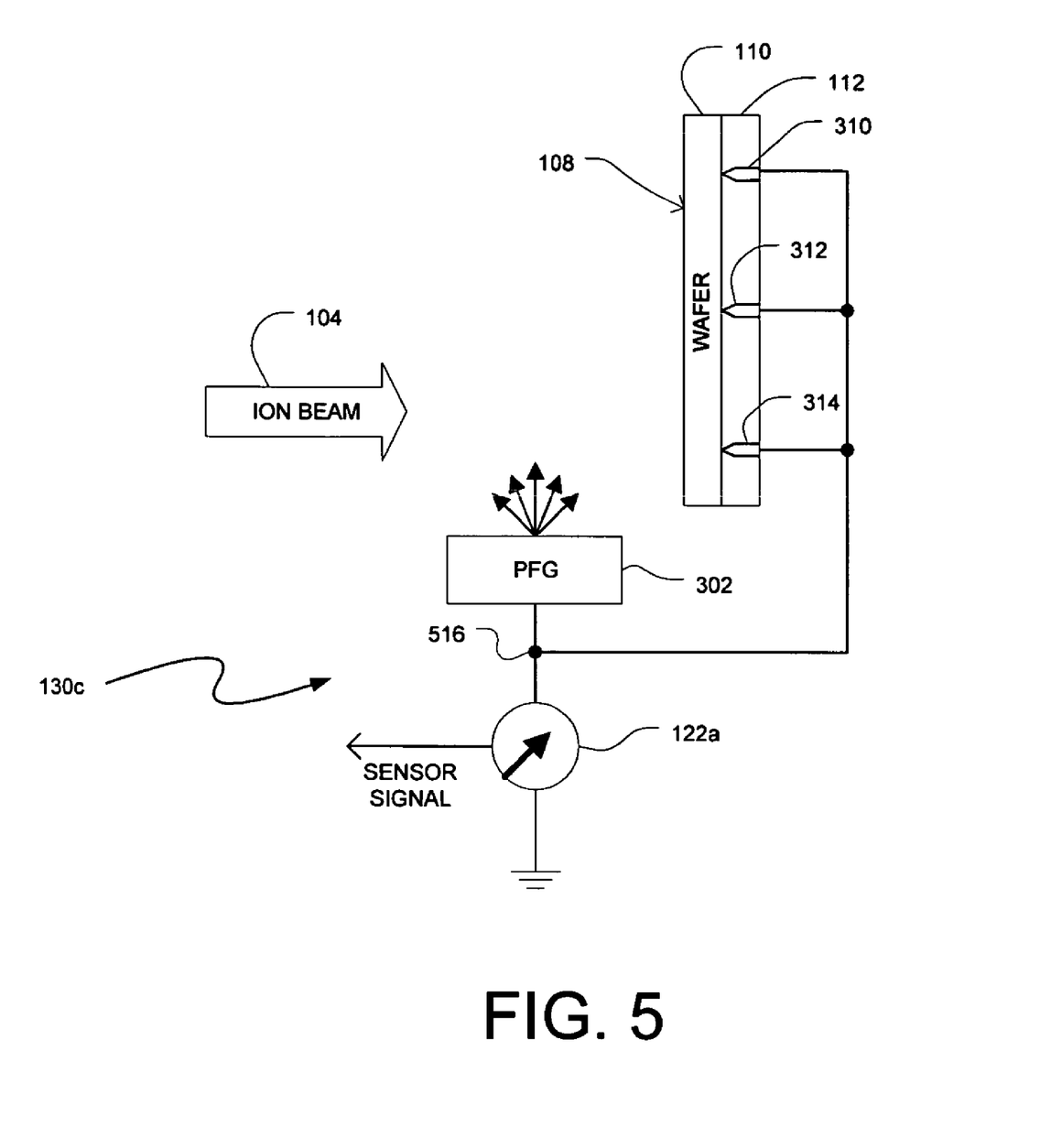
FIG. 5 is a schematic diagram of a third embodiment of the ion beam current monitoring system of FIG. 1.

FIG. 5 illustrates a diagram of a third embodiment of an ion beam current monitoring system 130c consistent with the ion beam current monitoring system 130 of FIG. 1. Compared to the embodiments of FIGS. 3 and 4, the third embodiment of FIG. 5 utilizes both the PFG 302 and the wafer grounding pin arrangement.

In operation, the PFG 302 and/or the grounding pins 310, 312, and 314 may provide the compensating current to control a charge on the front surface 108 of the wafer 110. The ammeter 122a may be coupled to ground and to node 516 to sense the compensating current provided by both the PFG 302 and the grounding pins. The quantity of the compensating current sensed by the ammeter 122a may depend on the presence and type of the ion beam 104, as well as any fluctuations in the beam current of the ion beam 104.

Figure 6:
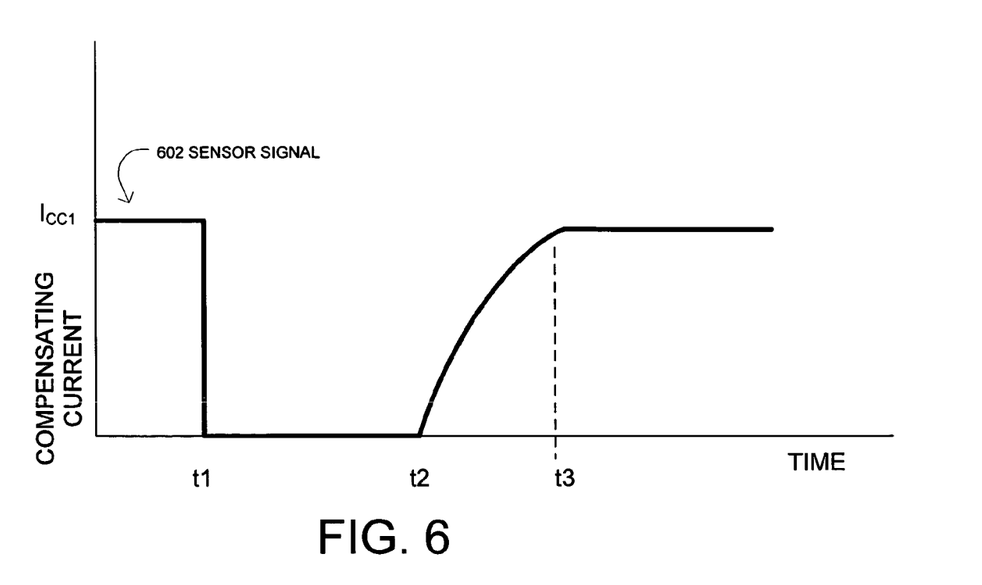
FIG. 6 is a plot of the sensor signal from the ammeter of FIG. 4, 5, or 6 associated with an interruption in the ion beam current.
Figure 7:
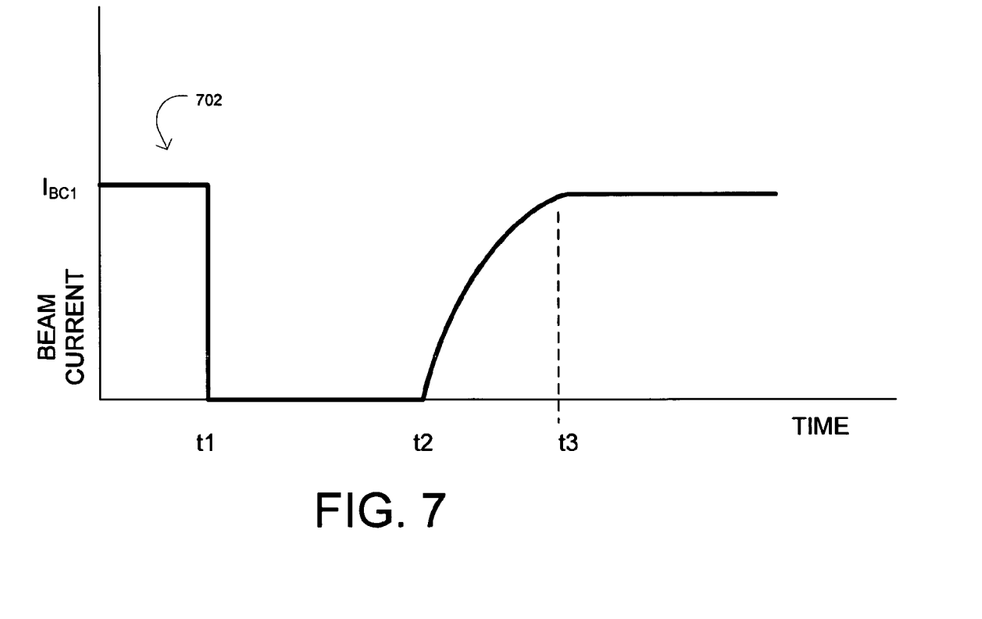
FIG. 7 is a plot of ion beam current corresponding to the sensor signal of FIG. 6.

FIG. 6 illustrates an example of a sensor signal 602 that may be provided by the ammeter 122a of FIG. 3, 4, or 5 as the ion beam 104 strikes the front surface 108 of the wafer 110. FIG. 7 illustrates a plot 702 of beam current of the ion beam 104 over the same time interval as FIG. 6. At time t1, the sensor signal 602 may sharply decrease from current $I_{CC1}$ to zero. The sensor signal 602 may remain at zero until time t2. Between times t2 and t3, the sensor signal 602 may increase back towards $I_{CC1}$ until it steadies at $I_{CC1}$ at time t3.

The sensor signal 602 may be representative of beam current of the ion beam 104 as illustrated in plot 702. At time t1, the beam current experiences an interruption as the beam current sharply decreases from an expected beam current $I_{BC1}$ down to zero. The reduction in the sensor signal 602 at time t1 is therefore representative of a start time t1 of the interruption in the beam current as illustrated in plot 702. The beam current may remain interrupted until time t2. The interruption in beam current may be due to any number of factors including, but not limited to, a glitch in one or more power supplies of the ion implantation system. An interruption in beam current may be referred to as a "glitch." The duration of the beam current interruption between times t2 and t3 may also vary, e.g., from tens of microseconds to milliseconds in some embodiments. Between times t2 and t3, the beam current may increase back towards $I_{BC1}$ until it steadies at $I_{BC1}$ at time t3.

Figure 8:
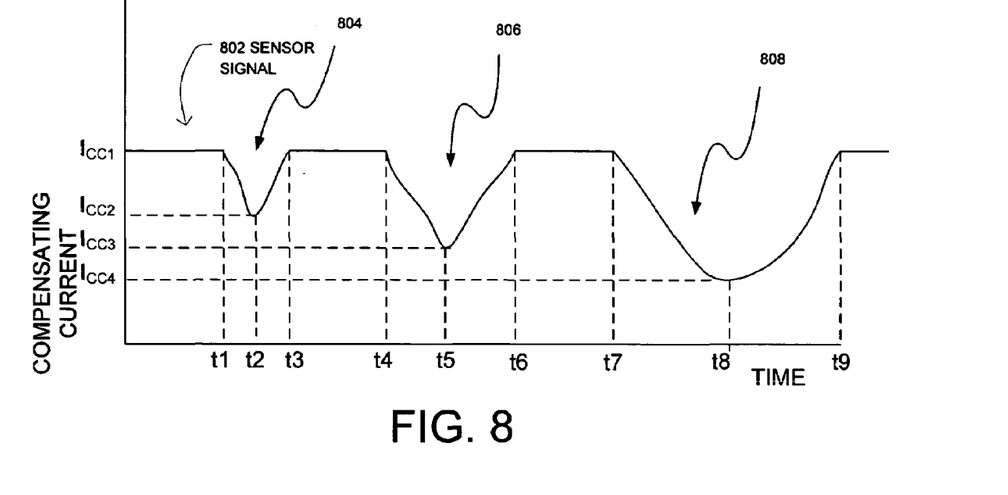
FIG. 8 is a plot of the sensor signal from the ammeter of FIG. 4, 5, or 6 associated with a plurality of reductions in the ion beam current.
Figure 9:
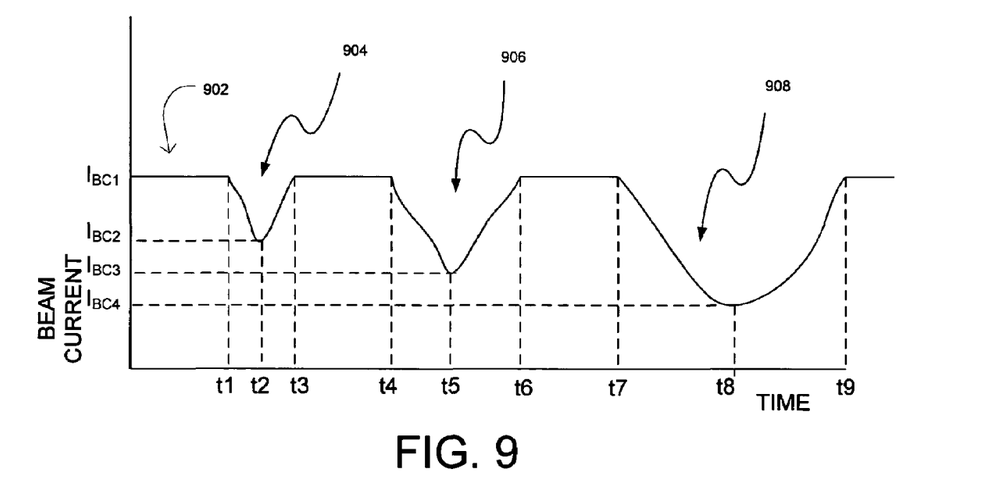
FIG. 9 is a plot of ion beam current corresponding to the sensor signal of FIG. 8.

FIG. 8 illustrates an example of another sensor signal 802 that may be provided by the ammeter 122a of FIG. 3, 4, or 5 as the ion beam 104 strikes the front surface 108 of the wafer 110. FIG. 9 illustrates a plot 902 of beam current of the ion beam 104 over the same time interval as FIG. 8. The sensor signal 802 illustrates three reductions 804, 806, 808 from an expected current level $I_{CC1}$ that vary in both duration and magnitude. For clarity of illustration, the expected current level $I_{CC1}$ is shown as a constant although it may vary with ion beam conditions and the type of ion beam, e.g. spot beam or ribbon beam. In addition, the three reductions 802, 804, 806 are shown in succession although for scanning of a spot beam they may occur during separate line scans if the sensor signal 802 is not able to recover back to $I_{CC1}$ before the next scan due to the speed of the scan.

A first reduction 804 in the sensor signal 802 may have a start time at time t1. The sensor signal may be reduced to $I_{cc2}$ at time t2. The first reduction 804 in the sensor signal 802 may have a first duration defined by time t3 minus time t1. A second reduction 806 may have a start time at time t4. The second reduction 806 may have a larger reduction in magnitude (to $I_{CC3}$ at time t5) than the first reduction 804. The second reduction 806 may also have a second duration (time t6 minus time t4) longer than the first duration of the first reduction 804. The third reduction 808 may have a larger reduction in magnitude than the second reduction 806 and may have a third duration (time t9 minus time t7) longer than the second duration of the second reduction 806.

The sensor signal 802 may be representative of beam current of the ion beam 104 as illustrated in plot 902. The plot 902 of beam current may have reductions 904, 906, 908 corresponding to the reductions 804, 806, 808 in the sensor signal 802. Accordingly, the reduction in the sensor signal 802 at times t1, t4, and t7 is representative of start times of reductions 904, 906, 908 in the beam current as illustrated in plot 902. In addition, the sensor signal 802 may also be representative of both the magnitude and duration of each reduction in the expected beam current.

Therefore, the sensor signal 802 may be utilized to sense fluctuations in the ion beam current that are not as severe as a complete interruption in ion beam current. These fluctuations may be caused by a number of factors including outgassing at the wafer 110. For instance, materials in or on the wafer 110 such as a photoresist on the surface of the wafer 110 may outgas or otherwise produce materials when impacted by particles in the ion beam 104. This may cause a pressure rise in the normally high vacuum condition along the beam line and can result in collisions between ions in the ion beam 104 and the released particles. These collisions can cause ions in the ion beam to experience a charge change. For example, singly positively charged ions in the ion beam 104 can be neutralized by collisions along the beamline. A more neutral ion beam due to such outgassing would require less compensating current from the charge neutralization source, e.g., on the order of about 5% less compensating current. Therefore, a compensating current on the order of about 5% less than an expected value for a wafer with a photoresist may be indicative of photoresist outgassing.

The sensor signal representative of the beam current may be provided to the controller 118 of an ion implantation system. The controller 118 may also receive other input signals such as a position signal from the position sensor 134 to sense the position of the wafer 110 relative to the ion beam 104. Since the start time of a reduction in expected ion beam current may be ascertained from the sensor signal, the controller 118 may correlate this start time with a position of the ion beam relative to the wafer 110 from analysis of the position signal.

If the reduction is the ion beam current is significant, e.g., it is an interruption as illustrated in FIG. 7, the controller 118 may stop the ion beam 104 from striking the wafer 110 and retune the ion beam to provide the expected beam current at a steady value. The controller 118 may then position the ion beam relative to the wafer 110 at their previous position when the start time of the reduction in ion beam current occurred. The ion implantation system may then continue with the ion implantation process by translating the ion beam relative to the wafer. Any deficiency in dose at the previous position of the wafer at the start of the reduction in beam current may therefore be corrected to improve dose uniformity of the wafer.

Figure 10:
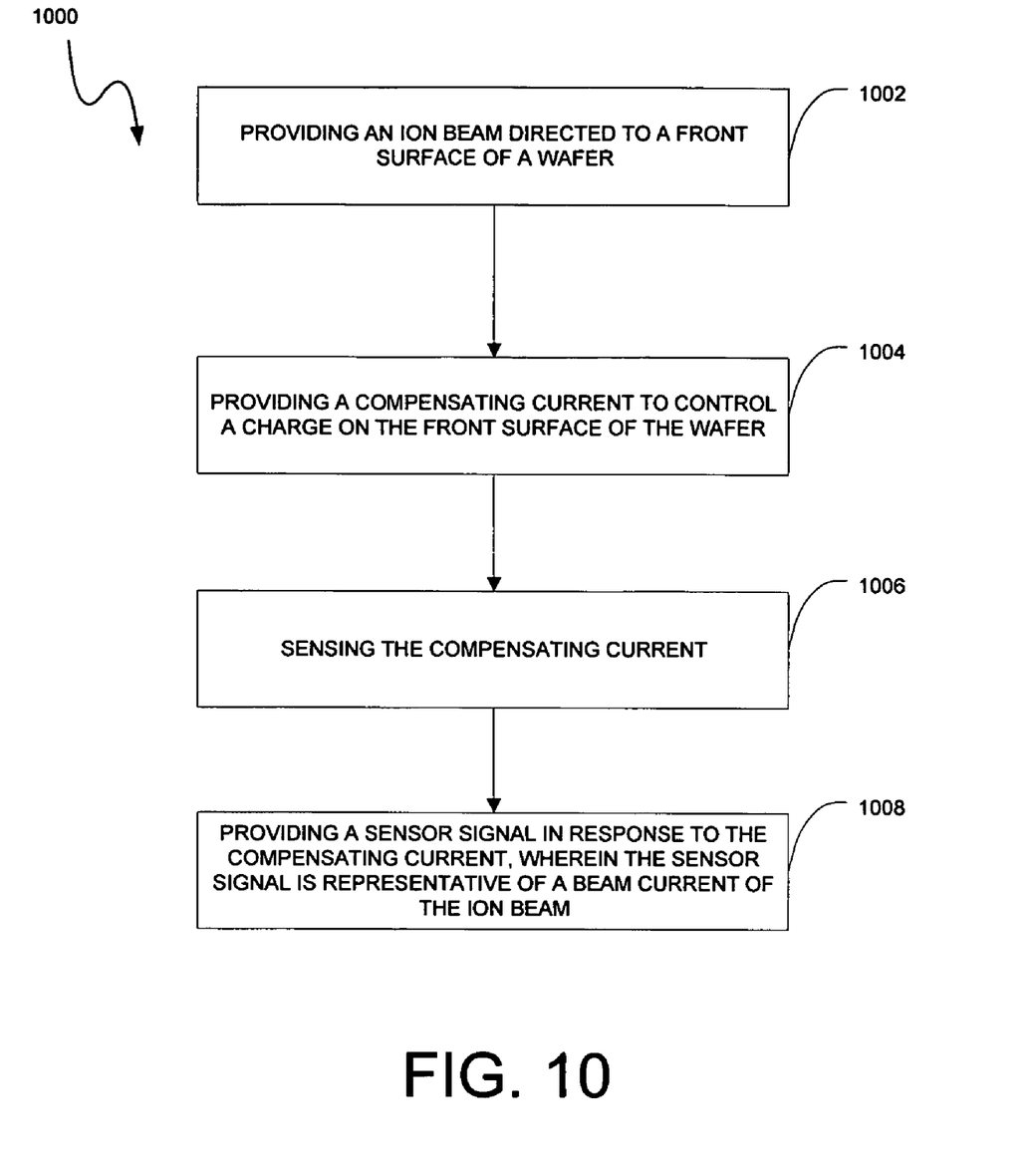
FIG. 10 is a flow chart of operations consistent with an embodiment of the invention.

Turning to FIG. 10, a flow chart 1000 of operations consistent with an embodiment of the invention is illustrated. Operation 1002 may include providing an ion beam directed to a front surface of a wafer. Operation 1004 may include providing a compensating current to control a charge on the front surface of the wafer. Operation 1006 may include sensing the compensating current, and operation 1008 may include providing a sensor signal in response to the compensating current, wherein the sensor signal is representative of a beam current of the ion beam.

Having thus described at least one illustrative embodiment of the invention, various alterations, modifications, and improvements will readily occur to those skilled in the art. Such alterations, modifications, and improvements are intended to be within the scope of the invention. Accordingly, the foregoing description is by way of example only and is not intended as limiting. The invention is limited only as defined in the following claims and the equivalents thereto.

What is claimed is:

1. An ion beam current monitoring system comprising:
   a charge neutralization system configured to provide a compensating current to control a charge on a front surface of a wafer; and
   a sensor configured to sense said compensating current and provide a sensor signal in response to said compensating current, wherein said sensor signal is representative of a beam current of an ion beam.

2. The ion beam current monitoring system of claim 1, wherein said charge neutralization system comprises a plasma flood gun configured to provide said compensating current to said ion beam to control said charge on said front surface of said wafer.

3. The ion beam current monitoring system of claim 2, wherein said sensor comprises an ammeter configured to provide said sensor signal, said ammeter coupled to said plasma flood gun and to ground.

4. The ion beam current monitoring system of claim 1, wherein if said beam current has an interruption when said ion beam strikes said front surface of said wafer, said sensor signal is representative of a start time of said interruption of said beam current.

5. The ion beam current monitoring system of claim 1, wherein if said beam current has a reduction from an expected beam current when said ion beam strikes said front surface of said wafer, said sensor signal is representative of a magnitude and a duration of said reduction of said expected beam current.

6. The ion beam current monitoring system of claim 1, wherein charge neutralization system comprises at least one grounding pin coupled to a rear surface of said wafer when said wafer is supported by a platen, wherein said at least one grounding pin is configured to provide said compensating current, and wherein said sensor comprises an ammeter coupled to said at least one grounding pin and to ground to sense said compensating current.

7. The ion beam current monitoring system of claim 1, wherein said charge neutralization system comprises a plasma flood gun and at least one grounding pin coupled to a rear surface of said wafer when said wafer is supported by a platen, wherein both said plasma flood gun and said at least one grounding pin are configured to provide said compensating current, and wherein said sensor comprises an ammeter to sense said compensating current.

8. A method comprising:
providing an ion beam directed to a front surface of a wafer;
providing a compensating current to control a charge on said front surface of said wafer;
sensing said compensating current; and
providing a sensor signal in response to said compensating current, wherein said sensor signal is representative of a beam current of said ion beam.

9. The method of claim 8, wherein said compensating current is provided by a plasma flood gun.

10. The method of claim 8, further comprising interrupting said beam current, and wherein said sensor signal is representative of a start time of said interruption of said beam current.

11. The method of claim 8, further comprising reducing said beam current from an expected beam current, and wherein said sensor signal is representative of a magnitude and a duration of said reduction in said expected beam current.

12. The method of claim 8, further comprising:
translating said ion beam relative to said wafer;
sensing a position of said ion beam relative to said wafer;
reducing said beam current from an expected beam current, wherein said sensor signal is representative of at least a start time of said reduction;
correlating said start time with a first position of said ion beam relative to said wafer;
stopping said ion beam from striking said wafer and retuning said ion beam to provide said expected beam current; and
positioning said ion beam relative to said wafer at said first position and continuing to provide said ion beam at said expected beam current to said front surface of said wafer while translating said ion beam relative to said wafer.

13. An ion implantation system comprising:
an ion beam generator configured to provide an ion beam directed to a front surface of a wafer;
a charge neutralization system configured to provide a compensating current to control a charge on a front surface of said wafer; and
a sensor configured to sense said compensating current and provide a sensor signal in response to said compensating current, wherein said sensor signal is representative of a beam current of said ion beam.

14. The ion implantation system of claim 13, further comprising:
a controller configured to control said ion beam generator in response to said sensor signal.

15. The ion implantation system of claim 14, further comprising:
a mechanism configured to translate said ion beam relative to said wafer; and
a position sensor configured to provide a position signal representative of a position of said ion beam relative to said wafer, said controller configured to control said ion beam generator in response to said sensor signal and said position signal, said controller further configured to correlate a start time of a reduction in said beam current with a position of said ion beam relative to said wafer at said start time.

16. The ion implantation system of claim 13, further comprising an end station configured to support said wafer and receive said ion beam, said end station comprising said charge neutralizing system.

17. The ion implantation system of claim 13, wherein said charge neutralization system comprises a plasma flood gun configured to provide said compensating current to said ion beam to control said charge on said front surface of said wafer.

18. The ion beam implantation system of claim 13, wherein if said beam current has an interruption when said ion beam strikes said front surface of said wafer, said sensor signal is representative of a start time of said interruption in said beam current.

19. An ion beam current monitoring system comprising:
a plasma flood gun configured to provide a compensating current to control a charge on a front surface of a wafer; and
a sensor configured to sense said compensating current and provide a sensor signal in response to said compensating current, wherein said sensor signal is representative of a beam current of an ion beam.

20. The ion beam current monitoring system of claim 19, wherein said sensor comprises an ammeter configured to provide said sensor signal, said ammeter coupled to said plasma flood gun and to ground.

21. The ion beam current monitoring system of claim 19, wherein if said beam current has an interruption when said ion beam strikes said front surface of said wafer, said sensor signal is representative of a start time of said interruption in said beam current.

* * * * *